(12) United States Patent
Chiu et al.

(10) Patent No.: US 10,306,803 B2
(45) Date of Patent: May 28, 2019

(54) WATER-COOLING RADIATOR UNIT AND WATER-COOLING MODULE USING SAME

(71) Applicant: ASIA VITAL COMPONENTS CO., LTD., New Taipei (TW)

(72) Inventors: Jung-Yi Chiu, New Taipei (TW); Fu-Kuei Chang, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 0 days.

(21) Appl. No.: 15/964,151

(22) Filed: Apr. 27, 2018

(65) Prior Publication Data

US 2018/0249592 A1 Aug. 30, 2018

Related U.S. Application Data

(63) Continuation of application No. 15/275,500, filed on Sep. 26, 2016, now Pat. No. 10,058,007.

(51) Int. Cl.
| | |
|---|---|
| *F28F 1/28* | (2006.01) |
| *F28F 3/04* | (2006.01) |
| *H05K 7/20* | (2006.01) |
| *F28D 1/047* | (2006.01) |

(52) U.S. Cl.
CPC ......... *H05K 7/20263* (2013.01); *F28D 1/047* (2013.01); *F28F 1/28* (2013.01); *F28F 3/04* (2013.01); *H05K 7/20272* (2013.01); *F28F 2250/08* (2013.01); *F28F 2250/102* (2013.01)

(58) Field of Classification Search
CPC .... B60H 1/00457; F28F 3/04; F28F 2250/08; F28F 2250/102; F28F 2250/10; F28F 5/00; F24F 1/0007; F24F 7/06; F28D 11/00; F28D 1/024; F28D 15/0208; F28D 2015/0291; F28D 15/025; F28D 20/0034; F28D 15/00; F28D 20/00; H01L 23/467; H05K 7/20263; H05K 7/20272
USPC ..... 165/244, 120, 121, 122, 104.31, 104.28, 165/104.19, 104.11
See application file for complete search history.

(56) References Cited

U.S. PATENT DOCUMENTS

2006/0005945 A1* 1/2006 Wei .................. H01L 23/467
165/80.3

* cited by examiner

*Primary Examiner* — Justin M Jonaitis
(74) *Attorney, Agent, or Firm* — Jackson IPG PLLC; Demian K. Jackson

(57) ABSTRACT

A water-cooling radiator unit and a water-cooling module using same are disclosed. The water-cooling radiator unit includes a main body divided into a first section, a second section and a transit zone, which are fluidly communicable with one another. The first section has a first flow passage system and an inlet formed thereon, the second section has a second flow passage system and an outlet formed thereon. The main body is internally filled with a cooling fluid, and the transit zone has a pump mounted therein. The water-cooling radiator unit can be fluidly connected to a water block via two tubes to form a water-cooling module. The pump drives the cooling fluid to circulate in the main body and between the water-cooling radiator unit and the water block, enabling the water-cooling module to provide upgraded heat-dissipation performance while the water block has a reduced volume.

4 Claims, 8 Drawing Sheets

A-A PROFILE

WATER-COOLING RADIATOR UNIT AND WATER-COOLING MODULE USING SAME

The present application is a Continuation of U.S. patent application Ser. No. 15/275,500, filed on Sep. 26, 2016.

FIELD OF THE INVENTION

The present invention relates to a water-cooling radiator unit and a water-cooling module using same, and more particularly to a water-cooling module, of which a pump for driving a cooling fluid to circulate is mounted in a water-cooling radiator unit instead of a water block, so that the water block can have a reduced volume while the water-cooling radiator unit enables increased cooling fluid circulating efficiency.

BACKGROUND OF THE INVENTION

Various kinds of currently available electronic devices have constantly increased operating speed and upgraded performance. Following the upgraded performance of the electronic devices, electronic elements inside the electronic devices also have increased working temperature. Generally, a thermal module is a combination of a radiator or a vapor chamber and a set of heat pipes designed to cool electronic elements. Cooling fans are also used with the thermal module to enable forced heat dissipation. Such a thermal module is disposed in an electronic device to remove as much heat as possible from the electronic elements without the ability of directly moving the heat away from the electronic device. Therefore, there are manufacturers who apply a water-cooling module to the cooling of the electronic devices. The water-cooling module includes a water block and a water-cooling radiator connected to each other via tubes, so that a cooling fluid circulates between the water block and the water-cooling radiator via flow passages formed by the tubes. The water block has a heat-exchange interface, which is in direct contact with an electronic element to absorb heat produced by the electronic element. The heat absorbed by the heat-exchange interface is transferred to and carried by the cooling fluid away from the water block. The heat-carrying cooling fluid is then guided by one of the tubes to the water-cooling radiator, which is disposed outside the electronic device, and is cooled. A pump provided in or externally connected to the water block is used to drive the cooling fluid to circulate between the water block and the water-cooling radiator. In the case of an electronic device having a very limited internal space, the water block for use therewith must have dimensions strictly meeting the narrow internal space of the electronic device. However, the water block with an internally provided pump usually has a volume not small enough for use with the electronic device having a narrow internal space. Therefore, it is very important to work out a way for solving the cooling problem of an electronic device with very limited internal space.

SUMMARY OF THE INVENTION

To solve the problem in the conventional water-cooling module, a primary object of the present invention is to provide a water-cooling radiator unit having a pump mounted thereon, so that a water block without a pump and having a reduced volume can be used with the water-cooling radiator unit to form a water-cooling module.

Another object of the present invention is to provide a water-cooling module that includes a water-cooling radiator unit having a pump mounted thereon, so that the water-cooling module can have improved cooling fluid circulating efficiency and use a water block without a pump but having a reduced volume.

To achieve the above and other objects, the water-cooling radiator unit according to the present invention includes a main body and a pump.

The main body includes a first section having a first flow passage system formed thereon, a second section having a second flow passage system formed thereon, and a transit zone located between the first and the second section and fluidly communicable with the first and the second flow passage system. The first section is provided with an inlet, the second section is provided with an outlet, and the transit zone is formed with a plurality of first apertures fluidly communicable with the first flow passage system on the first section, a water-guiding opening formed on a bottom of the transit zone and fluidly communicable with the first apertures via a bottom passage, and a plurality of second apertures fluidly communicable with the second flow passage system on the second section. And, the main body is internally filled with a cooling fluid.

The pump is mounted in the transit zone and includes a plurality of blades for driving the cooling fluid filled in the main body to circulate in the main body.

To achieve the above and other objects, the water-cooling module according to the present invention includes a water-cooling radiator unit, a pump, a water block, a first tube and a second tube.

The water-cooling radiator unit according to the present invention includes a main body, which includes a first section having a first flow passage system formed thereon, a second section having a second flow passage system formed thereon, and a transit zone located between the first and the second section and fluidly communicable with the first and the second flow passage system. The first section is provided with an inlet, the second section is provided with an outlet, and the transit zone is formed with a plurality of first apertures fluidly communicable with the first flow passage system on the first section, a water-guiding opening formed on a bottom of the transit zone and fluidly communicable with the first apertures via a bottom passage, and a plurality of second apertures fluidly communicable with the second flow passage system on the second section. And, the main body is internally filled with a cooling fluid.

The pump is mounted in the transit zone and includes a plurality of blades for driving the cooling fluid filled in the main body to circulate in the main body.

The water block has an enclosure, which internally defines at least one water-receiving space and includes a heat-exchange interface, a water inlet and a water outlet; and the water inlet and the water outlet are fluidly communicable with the water-receiving space. The heat-exchange interface is formed on one side of the enclosure and in contact with the water-receiving space.

The first tube has a first end and a second end connected to the water inlet on the water block and the outlet on the main body, respectively.

The second tube has a third end and a fourth end connected to the water outlet on the water block and the inlet on the main body, respectively.

By mounting the pump in the water-cooling radiator unit in stead of the water block, the water block can have a reduced height and volume, enabling it to be used in a narrow space, and the cooling fluid can be circulated more efficiently. Further, the assembling of the water-cooling module is easier to prevent the water-cooling module from the risk of leakage.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
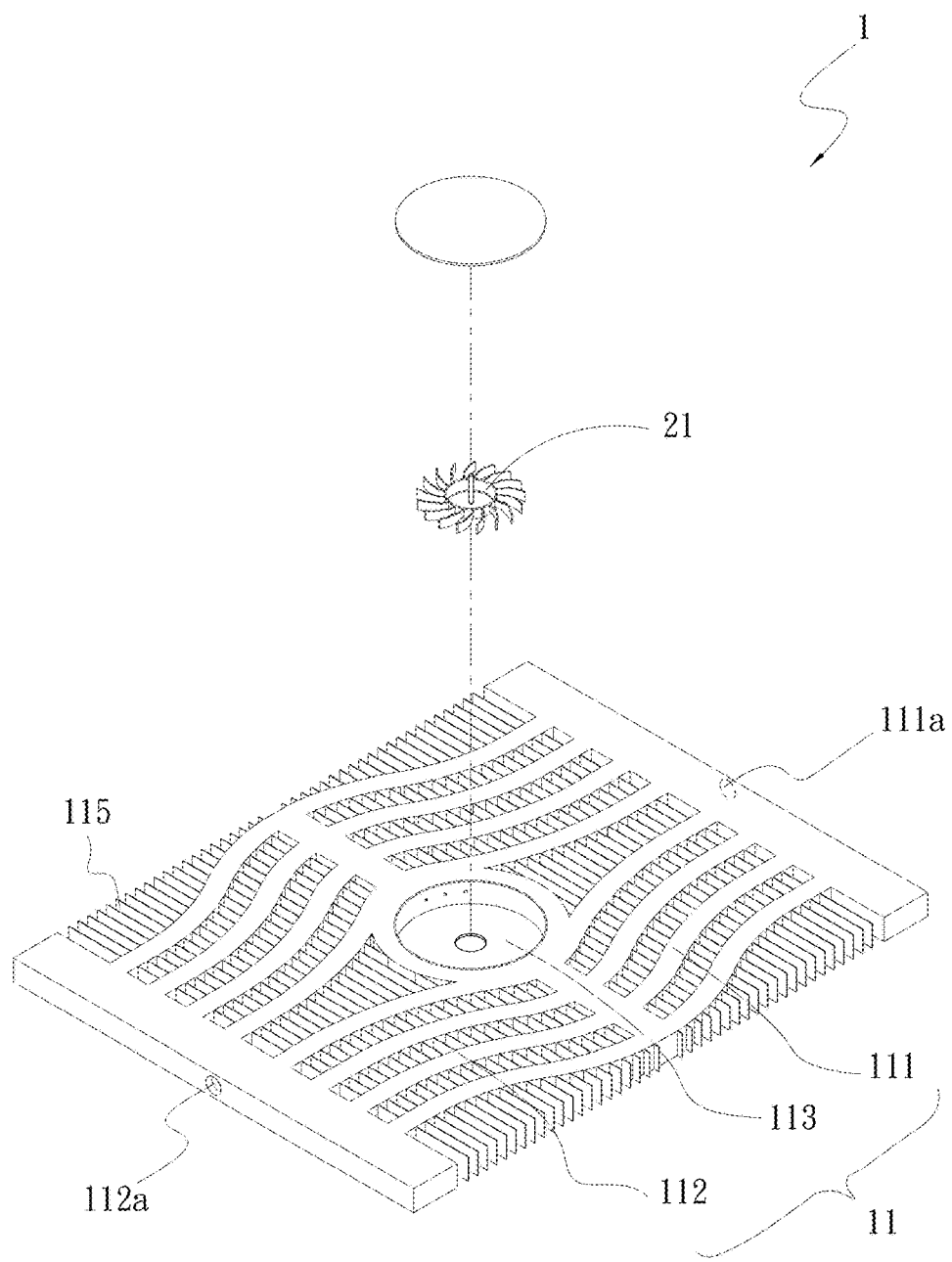
FIG. 1 is a perspective view of a first embodiment of a water-cooling radiator unit according to the present invention.

The present invention will now be described with some preferred embodiments thereof and by referring to the accompanying drawings. For the purpose of easy to understand, elements that are the same in the preferred embodiments are denoted by the same reference numerals.

Figure 2:
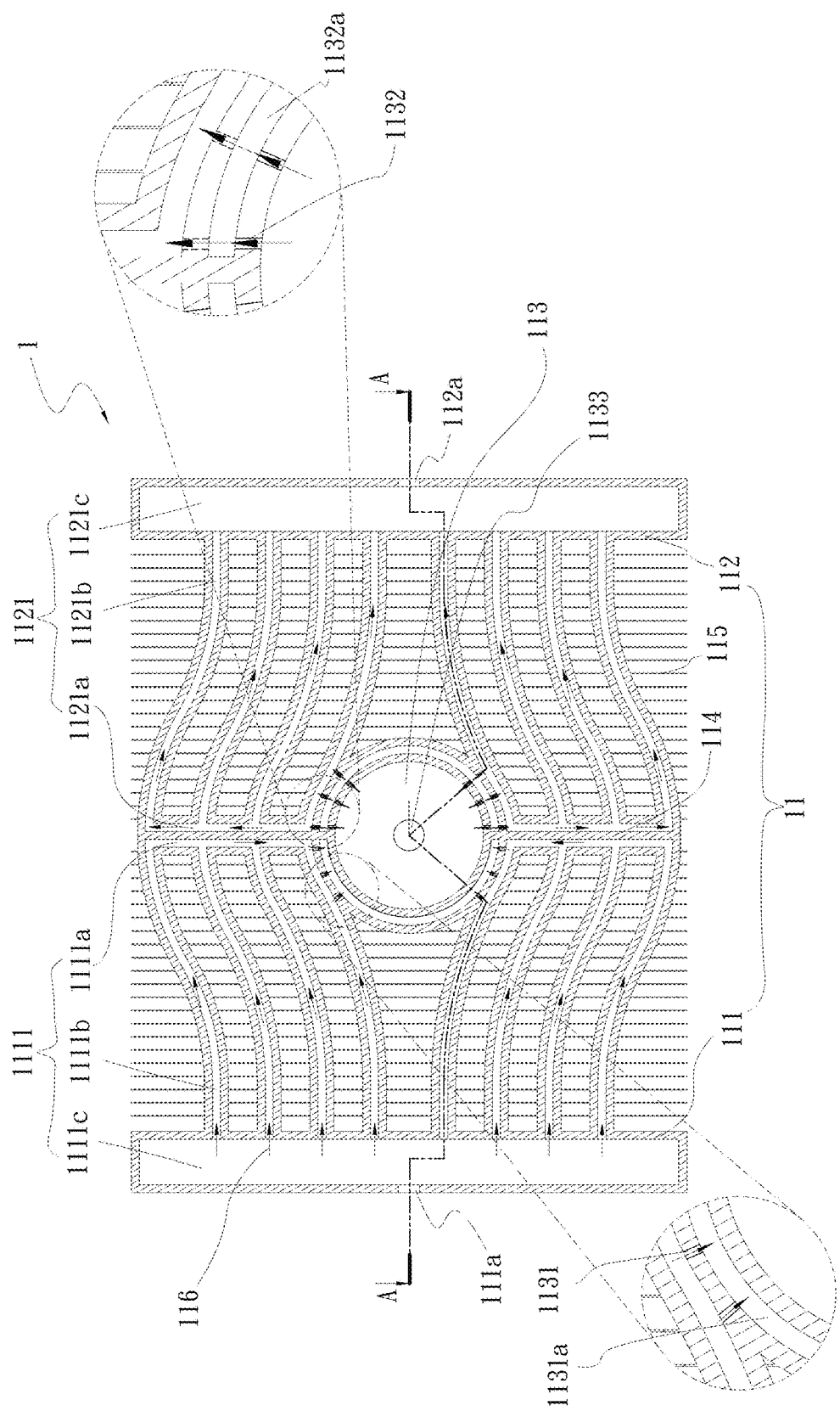
FIG. 2 is a cross-sectional view of the water-cooling radiator unit of FIG. 1.
Figure 3:
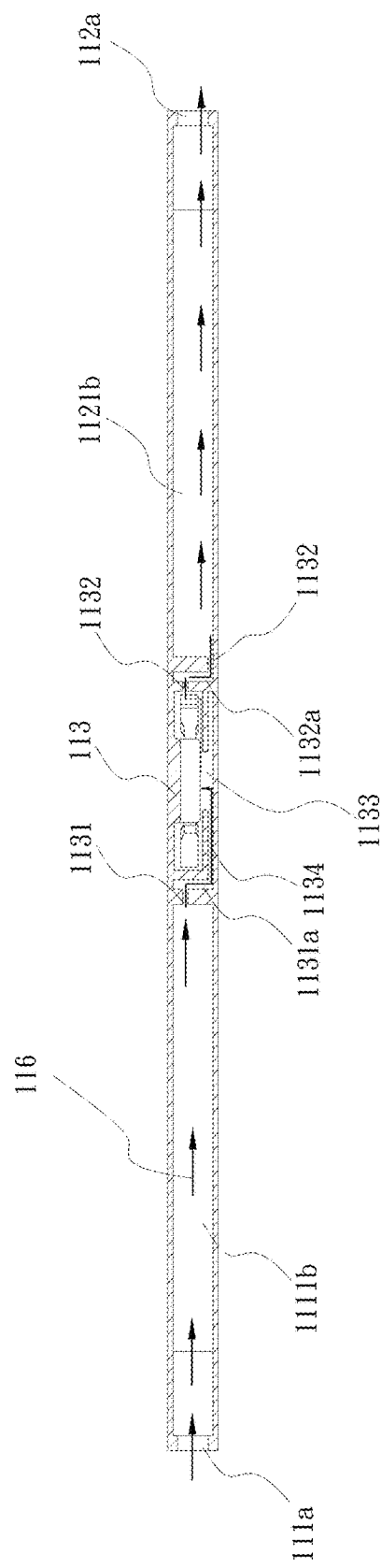
FIG. 3 is a sectional view taken along line A-A of FIG. 2.

Please refer to FIGS. 1, 2 and 3, wherein FIGS. 1 and 2 are perspective and cross-sectional views, respectively, of a first embodiment of a water-cooling radiator unit 1 according to the present invention, and FIG. 3 is a sectional view taken along line A-A of FIG. 2. As shown, the water-cooling radiator unit 1 in the first embodiment thereof includes a main body 11 and a pump 21.

The main body 11 includes a first section 111, a second section 112 and a transit zone 113. In the first and the second section 111, 112, there are formed a first flow passage system 1111 and a second flow passage system 1121, respectively. A partitioning section 114 is formed between the first section 111 and the second section 112 to define and separate the two sections 111, 112 from each other.

The first flow passage system 1111 includes a plurality of first transverse flow passages 1111a and a plurality of first longitudinal flow passages 1111b, which are fluidly communicable with one another. The first transverse flow passages 1111a are located adjacent to one side of the partitioning section 114, and the first longitudinal flow passages 1111b are spaced from one another with a plurality of radiating fins 115 formed between any two adjacent first longitudinal flow passages 1111b.

The second flow passage system 1121 includes a plurality of second transverse flow passages 1121a and a plurality of second longitudinal flow passages 1121b, which are fluidly communicable with one another. The second transverse flow passages 1121a are located adjacent to another side of the partitioning section 114, and the second longitudinal flow passages 1121b are spaced from one another with a plurality of radiating fins 115 formed between any two adjacent second longitudinal flow passages 1121b.

The transit zone 113 is located between the first and the second section 111, 112 to be fluidly communicable with the first and the second flow passage system 1111, 1121 formed in the first and the second section 111, 112, respectively. The first section 111 has an inlet 111a provided thereon to be fluidly communicable with the first flow passage system 1111. Similarly, the second section 112 has an outlet 112a provided thereon to be fluidly communicable with the second flow passage system 1121.

The transit zone 113 is formed with a plurality of first apertures 1131, a water-guiding opening 1133 and a plurality of second apertures 1132. The first apertures 1131 are fluidly communicable with the first flow passages 1111 in the first section 111, and the second apertures 1132 are fluidly communicable with the second flow passages 1121 in the second section 112. The water-guiding opening 1133 is formed on a bottom of the transit zone 113 and is fluidly communicable with the first apertures 1131 via a bottom passage 1134. The main body 11 is internally filled with a cooling fluid 116. The bottom passage 1134 is located below the bottom of the transit zone 113.

The first apertures 1131 radially penetrate wall portions of the transit zone 113 located adjacent to the first section 111, bringing the first transverse flow passages 1111a and the first longitudinal flow passages 1111b to be fluidly communicable with the bottom passage 1134. The second apertures 1132 radially penetrate wall portions of the transit zone 113 located adjacent to the second section 112, bringing the transit zone 113 to be fluidly communicable with the second flow passage system 1121.

Figure 4:
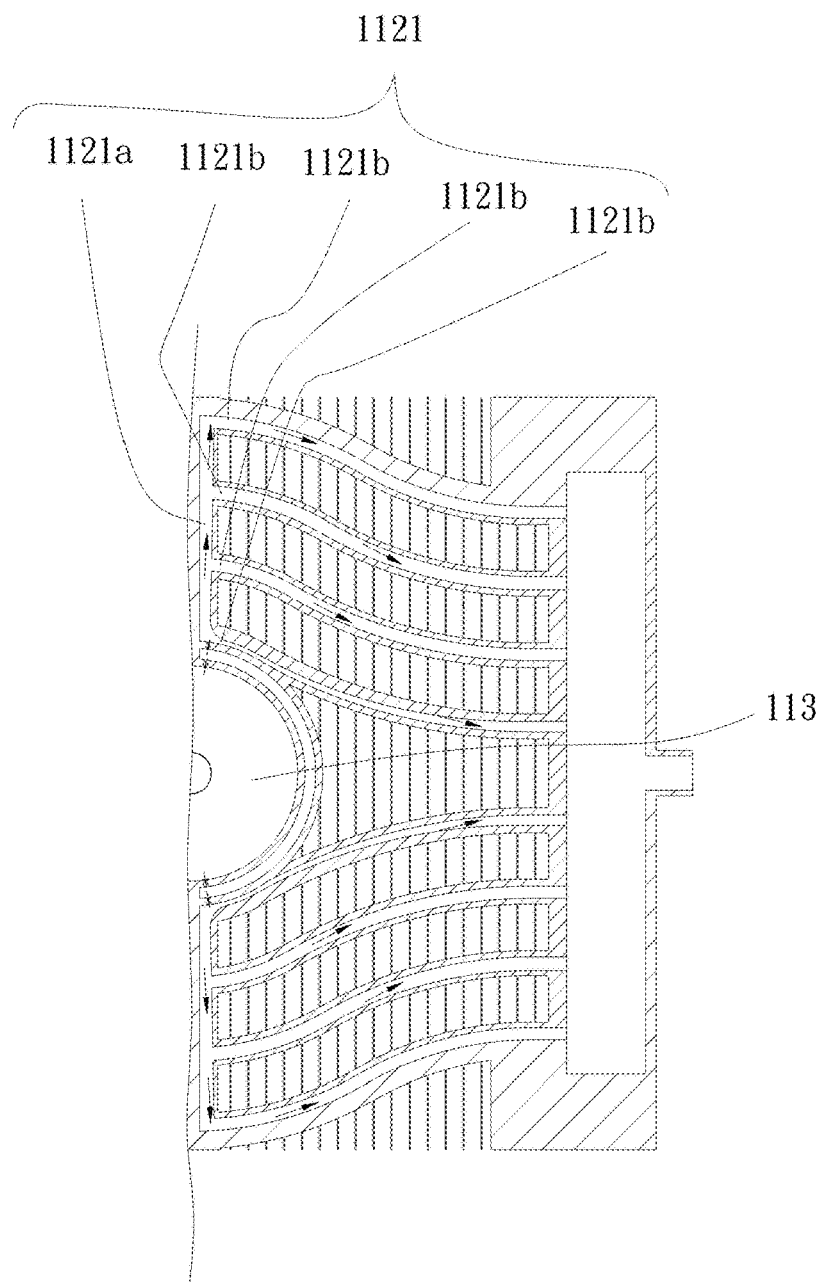
FIG. 4 is another cross-sectional view of the water-cooling radiator unit of FIG. 1.

Please refer to FIG. 4. Joints between the second transverse flow passages 1121a and the second longitudinal flow passages 1121b of the second flow passage system 1121 are not the same in their internal diameters. More specifically, the joints between the second transverse flow passages 1121a and the second longitudinal flow passages 1121b that are closer to the transit zone 113 respectively have a relatively smaller internal diameter, and the joints between the second transverse flow passages 1121a and the second longitudinal flow passages 1121b that are farther from the transit zone 113 respectively have a relatively larger internal diameter. By controlling the internal diameters of the joints between the second transverse and the second longitudinal flow passages, the cooling fluid 116 can be evenly distributed to flow through each of the second longitudinal flow passages 1121b.

The transit zone 113 further includes a first reservoir 1131a and a second reservoir 1132a formed in the wall of the transit zone 113. The first reservoir 1131a is fluidly communicable with the first flow passage system 1111 and the first apertures 1131. The second reservoir 1132a is fluidly communicable with the second flow passage system 1121 and the second apertures 1132. The second apertures 1132 are formed on an inner and an outer wall of the second reservoir 1132a. Herein, the inner wall of the second reservoir 1132a is a wall located adjacent to the transit zone 113, and the outer wall of the second reservoir 1132a is another wall located adjacent to the second section 112. It is noted the second apertures 1132 formed on the inner wall of the second reservoir 1132a and the second apertures 1132 formed on the outer wall of the second reservoir 1132a are located at different heights with a height difference "a" existed between them. More specifically, the second apertures 1132 formed on the inner wall are located higher than the second apertures 1132 formed on the outer wall. The second reservoir 1132a provides the function of stabilizing fluid flow and fluid pressure, enabling the cooling fluid 116 flowing into the water-cooling radiator unit 1 to continuously circulate at stable flow rate and pressure and accordingly, upgraded circulation efficiency.

The first section 111 further includes a first water chamber 1111c, which is fluidly communicable with the first flow passage system 1111. Similarly, the second section 112 further includes a second water chamber 1121c, which is fluidly communicable with the second flow passage system 1121.

The pump 21 is mounted in the transit zone 113 of the water-cooling radiator unit 1. The pump 21 is provided with a plurality of blades 211 and is used to drive the cooling fluid 116 flowed into the main body 11 to circulate in the main body 11.

The pump 21 can be, but not limited to, any conventional pump that has already been in public use and is suitable for use with the main body 11 of the water-cooling radiator unit 1.

Figure 5:
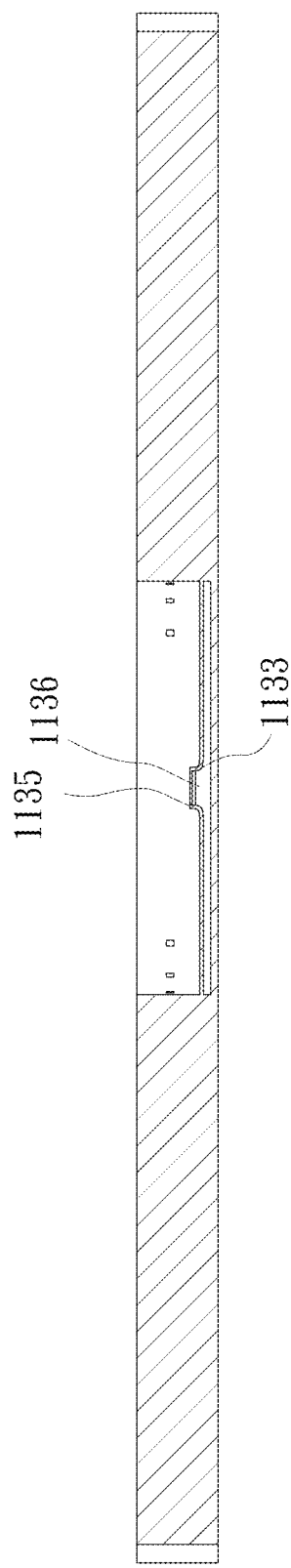
FIG. 5 is an assembled sectional side view of a second embodiment of the water-cooling radiator unit according to the present invention.

Please refer to FIG. 5, which is an assembled sectional side view of a second embodiment of the water-cooling radiator unit 1 according to the present invention. As shown, the water-cooling radiator unit 1 in the second embodiment is generally structurally similar to the first embodiment, except for a raised section 1135 upward extended around the water-guiding opening 1133. The raised section 1135 is upward tapered and internally defines a through hole 1136, which is fluidly communicable with the water-guiding opening 1133.

Figure 6:
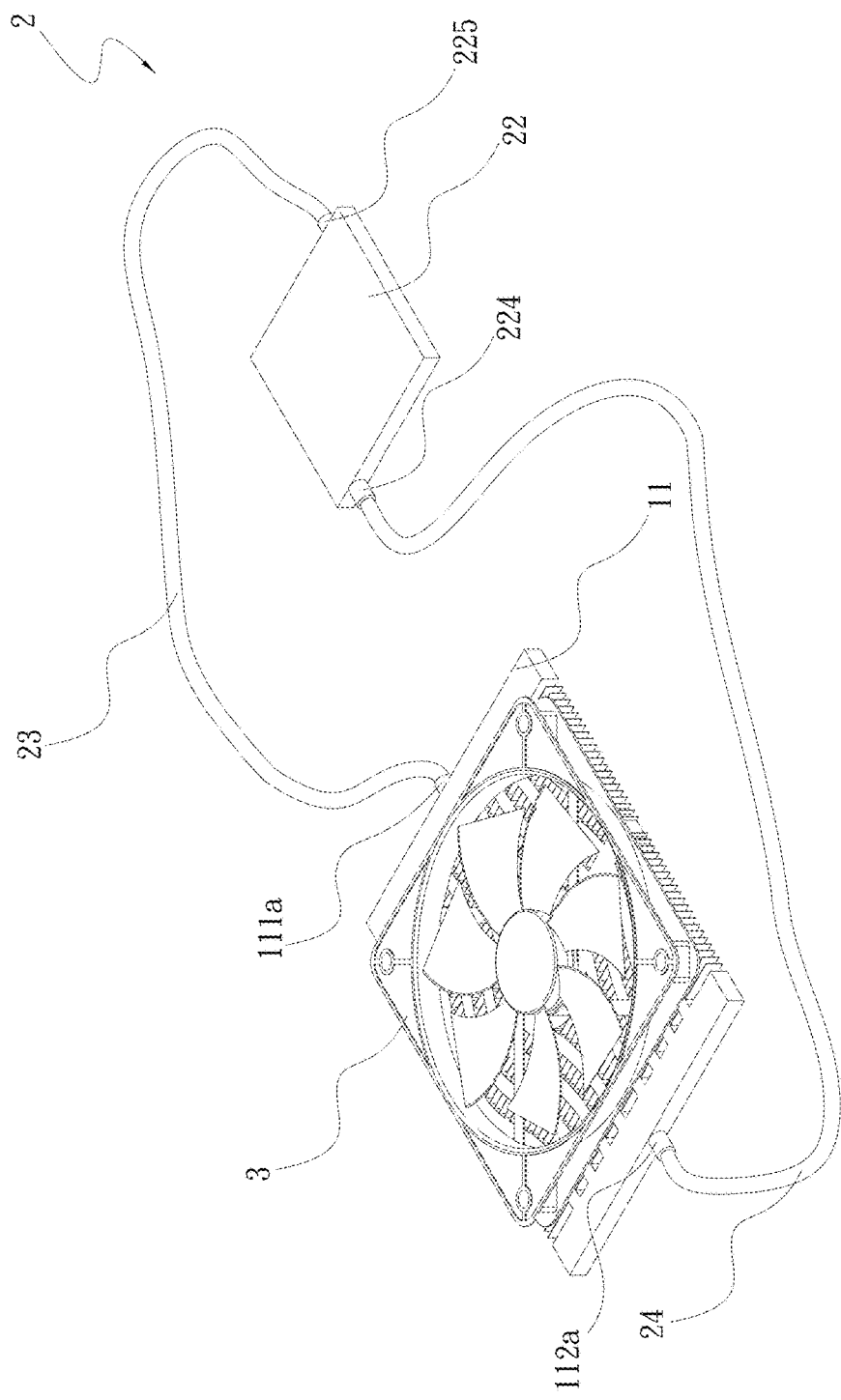
FIG. 6 is an assembled perspective view of a first embodiment of a water-cooling module according to the present invention.
Figure 7:
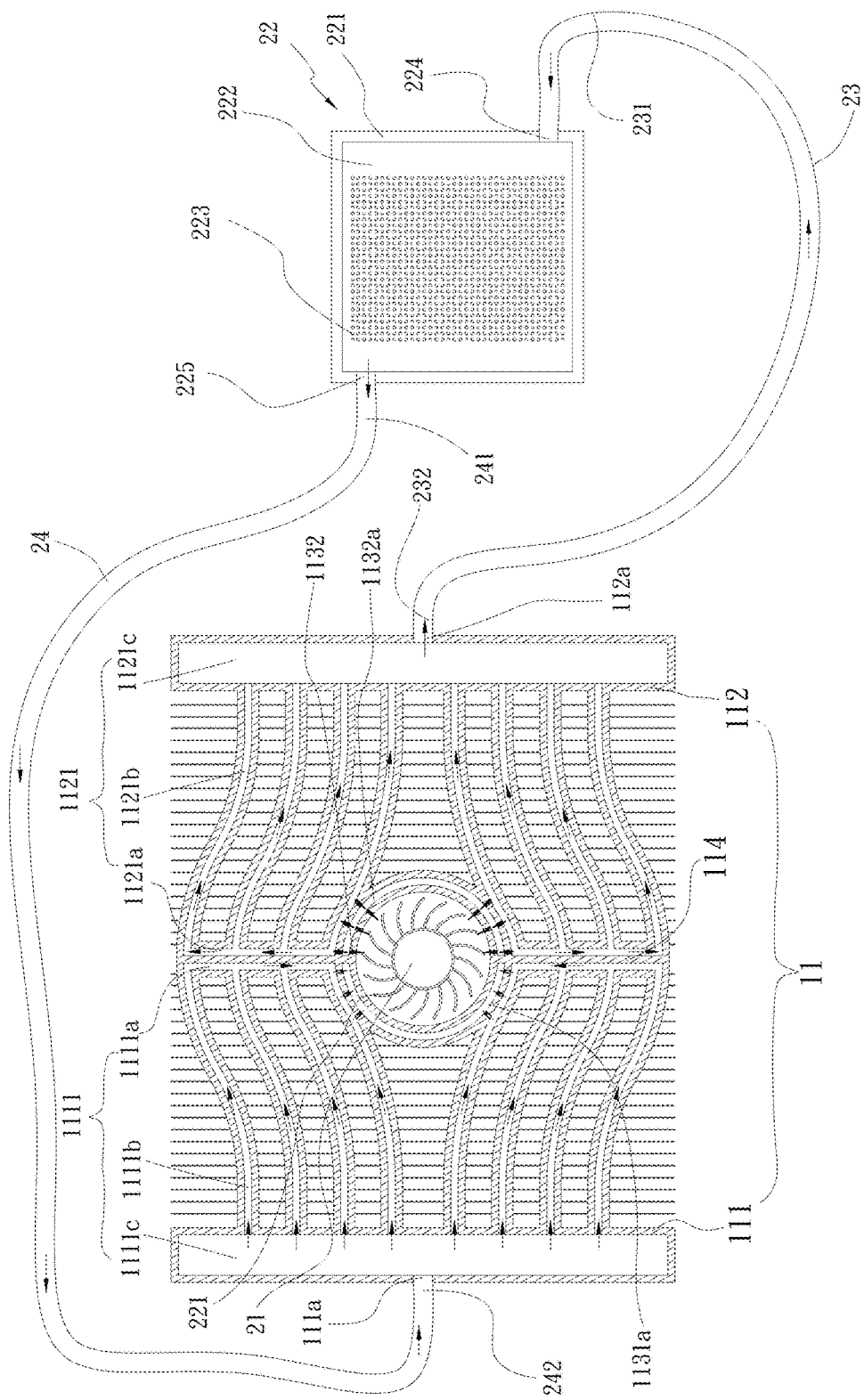
FIG. 7 is a cross-sectional view of the water-cooling module of FIG. 6.

Please refer to FIGS. 6 and 7, which are assembled perspective and cross-sectional views, respectively, of a first embodiment of a water-cooling module 2 according to the present invention. As shown, the water-cooling module 2 in the first embodiment thereof includes a water-cooling radiator unit 1, a pump 2, a water block 22, a first tube 23 and a second tube 24.

Since the water-cooling radiator unit 1 included in the water-cooling module 2 is identical to that having been described with reference to FIGS. 1 to 4, it is not repeatedly described herein.

The water block 22 has an enclosure 221, which internally defines at least one water-receiving space 222 and includes a heat-exchange interface 223, a water inlet 224 and a water outlet 225. The water inlet 224 and the water outlet 225 are fluidly communicable with the water-receiving space 222; and the heat-exchange interface 223 is formed on one side of the enclosure 221 and in contact with the water-receiving space 222.

The first tube 23 has a first end 231 and a second end 232 connected to the water inlet 224 on the water block 22 and the outlet 112a on the main body 11, respectively.

The second tube 24 has a third end 241 and a fourth end 242 connected to the water outlet 225 on the water block 22 and the inlet 111a on the main body 11, respectively.

The water-cooling module 2 in the first embodiment thereof is characterized in that the pump 21 is mounted in the transit zone 113 of the water-cooling radiator unit 1 and that the water-cooling radiator unit 1 with the pump 21 mounted thereon is connected to the water block 22 via the first and the second tube 23, 24. With these arrangements, the water-cooling module 2 can provide cooling function through circulation of a cooling fluid 116 between the water-cooling radiator unit 1 and the water block 22. The water-cooling module 2 of the present invention is significantly different from prior art water-cooling modules in that the pump 21 is removed from the water block 22 to reduce an overall volume of the water block 22, enabling the water block 22 to be easily mounted in a heat-producing electronic device that has a very limited internal space. The pump 21 removed from the water block 22 is now mounted in the water-cooling radiator unit 1, which can be externally connected to the heat-producing electronic device without being limited by the narrow internal space of the electronic device. With this arrangement, the water block 22 can have a reduced volume and the pump 21 can directly drive the cooling fluid 116 in the water-cooling radiator unit 1 to circulate more efficiently to provide improved cooling effect.

In the water-cooling module 2 according to the first embodiment thereof, the water block 22 is in direct contact with a heat source (not shown) for absorbing and transferring the heat to the cooling fluid 116, the water-cooling radiator unit 1 is connected to the water block 22 via the first and second tubes 23, 24 to cool the cooling fluid 116, the heat-exchange interface 223 has an inner side facing and contacting with the water-receiving space 222 defined in the water block 22, and the cooling fluid 116 circulates in the water-receiving space 222 to carry away the heat absorbed by the heat-exchange interface 223. The water-cooling module 2 of the present invention is characterized in the structural arrangements of the water-cooling radiator unit 1. More specifically, in the water-cooling radiator unit 1, the partitioning section 114 divides the main body 11 into the first and the second section 111, 112, which serve as a water-in area and a water-out area, respectively; and the transit zone 113 is a key area for driving the cooling fluid 116 to circulate in the main body 11. The transit zone 113 is characterized in having the first apertures 1131 and the second apertures 1132 provided thereat. The second apertures 1132 are formed on the wall located between the transit zone 113 and the second reservoir 1132a, the water-guiding opening 1133 is formed on the bottom of the transit zone 113 and communicates with the first apertures 1131 via the bottom passage 1134. When the cooling fluid 116 has flowed into the first flow passage system 1111 via the inlet 111a on the water-cooling radiator unit 1, it further flows through the first longitudinal flow passages 1111b and the first transverse flow passages 1111a of the first flow passage system 1111 toward the transit zone 113. The cooling fluid 116 passes through the first apertures 1131 into the bottom passage 1134 located below the transit zone 113 and then passes through the water-guiding opening 1133 formed on the bottom of the transit zone 113 to finally enter the transit zone 113. At this point, the cooling fluid 116 is driven by the blades 211 of the pump 21 mounted in the transit zone 113 to flow through the second apertures 1132 to leave the transit zone 113 and enter into the second reservoir 1132a. The cooling fluid 116 keeps flowing through the second apertures 1132 formed on the outer wall of the second reservoir 1132a into the second flow passage system 1121. Then, the cooling fluid 116 flows through the second transverse flow passages 1121a and the second longitudinal flow passages 1121b of the second flow passage system 1121 toward the outlet 112a on the second section 112 to finally leaves the water-cooling radiator unit 1. Thereafter, the cooling fluid 116 flows back into the water block 22 via the first tube 23, which is connected to the water inlet 224 of the water block 22. At this point, the cooling fluid 116 has already been cooled and circulates in the water-receiving space 222 of the water block 22 to carry away the heat absorbed by the heat-exchange interface 223 before leaving the water-receiving space 222 of the water block 22 via the water outlet 225. The heat-carrying cooling fluid 116 then flows into the water-cooling radiator unit 1 again via the second tube 24, which is connected at the third end 241 to the water outlet 225 of the water block 22 and at the fourth end 242 to the inlet 111a provided on the main body 11 of the water-cooling radiator unit 1. The heat-carrying cooling fluid 116 is cooled again when it flows through the water-cooling radiator unit 1.

The water-cooling module 2 of the present invention is characterized in that the water block 22 has a reduced volume because the pump 21 is not provided in the water block 22 but is mounted on the water-cooling radiator unit 1 to facilitate the circulation and cooling of the cooling fluid 116 in the water-cooling radiator unit 1. With this arrangement, the water block 22 can still be used in an electronic device that has a very limited internal space to maintain good cooling and circulation of the cooling fluid 116.

A cooling fan 3 can be correspondingly connected to one side of the water-cooling radiator unit 1 to enable forced heat dissipation from the water-cooling radiator unit 1 and more efficient cooling of the cooling fluid 116 in the water-cooling radiator unit 1. Further, by providing the first and second flow passage systems 1111, 1121 in the whole water-cooling radiator unit 1 and by mounting the cooling fan 3 to one side of the water-cooling radiator unit 1 to enable forced heat dissipation, the heat carried by the cooling fluid 116 and the heat absorbed by the main body 11 of the water-cooling radiator unit 1 can be more quickly dissipated into ambient environment to cool the main body 11 and the cooling fluid 116. The cooled cooling fluid 116 can flow back into the water block 22 again to carry away the heat produced by the electronic device.

Figure 8:
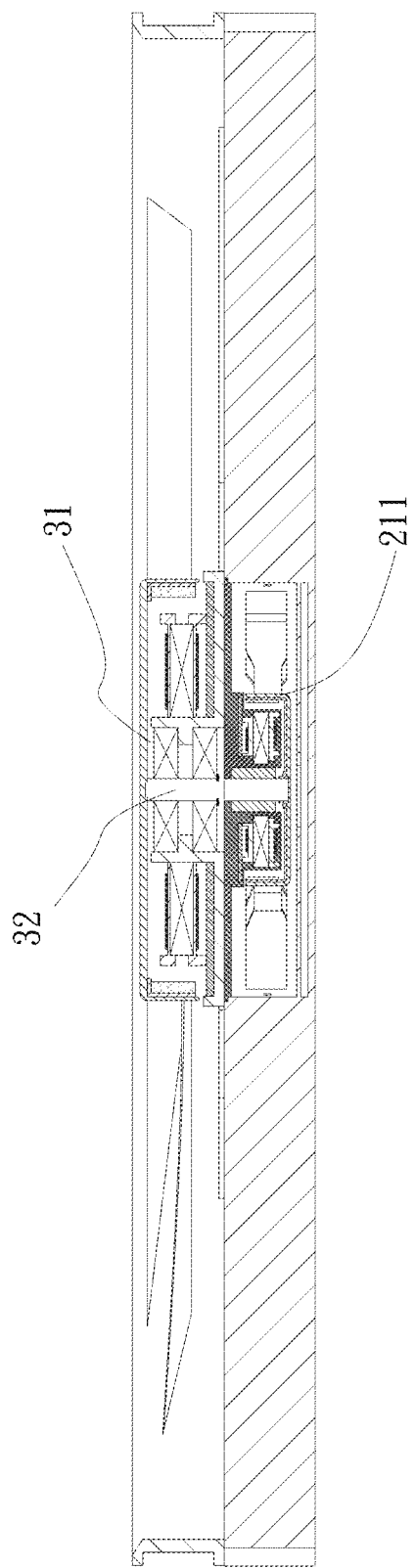
FIG. 8 is an assembled sectional side view of a second embodiment of the water-cooling module according to the present invention.

FIG. 8 is an assembled sectional side view of a second embodiment of the water-cooling module 2 according to the present invention. As shown, the water-cooling module 2 in the second embodiment is generally structurally similar to that in the first embodiment. Therefore, structures of the second embodiment that are the same as the first embodiment are not repeatedly described herein. The water-cooling module 2 in the second embodiment is different from the first one in that the pump 21 mounted on the water-cooling radiator unit 1 includes a plurality of blades 211 and the cooling fan 3 includes a fan hub 31; and the fan hub 31 is associated with the blades 211 via a shaft 32. When the cooling fan 3 rotates, it brings the blades 211 of the pump 21 to rotate at the same time to achieve the effect of energy-saving.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A water-cooling radiator unit, comprising:
   a main body including a first section having a first flow passage system formed thereon, a second section having a second flow passage system formed thereon, and a transit zone located between the first and the second section and fluidly communicable with the first and the second flow passage system; the first section being provided with an inlet, the second section being provided with an outlet, and the transit zone being formed with a plurality of first apertures fluidly communicable with the first flow passage system on the first section, a water-guiding opening formed on a bottom of the transit zone and fluidly communicable with the first apertures via a bottom passage, and a plurality of second apertures fluidly communicable with the second flow passage system on the second section; and the main body being internally filled with a cooling fluid;
   a pump being mounted in the transit zone and including a plurality of blades for driving the cooling fluid filled in the main body to circulate in the main body; and
   a partitioning section for defining and separating the first and the second section from each other; the first flow passage system including a plurality of fluidly communicable first transverse flow passages and first longitudinal flow passages.

2. The water-cooling radiator unit as claimed in claim 1, wherein the first transverse flow passages being located adjacent to one side of the partitioning section; the bottom passage being located below the bottom of the transit zone, and the first apertures radially penetrating wall portions of the transit zone located adjacent to the first section and bringing the first transverse flow passages and the first longitudinal flow passages to be fluidly communicable with the bottom passage; the second flow passage system including a plurality of fluidly communicable second transverse flow passages and second longitudinal flow passages, and the second transverse flow passages being located adjacent to another side of the partitioning section and fluidly communicable with the second apertures; the second apertures radially penetrating wall portions of the transit zone located adjacent to the second section and bringing the transit zone to be fluidly communicable with the second flow passage system; the first longitudinal flow passages being spaced from one another with a plurality of radiating fins formed between any two adjacent first longitudinal flow passages; and the second longitudinal flow passages being spaced from one another with a plurality of radiating fins formed between any two adjacent second longitudinal flow passages.

3. The water-cooling radiator unit as claimed in claim 1, wherein the transit zone further includes a first reservoir and a second reservoir formed in a wall of the transit zone; the first reservoir being fluidly communicable with the first flow passage system and the first apertures; and the second reservoir being fluidly communicable with the second flow passage system and the second apertures.

4. The water-cooling radiator unit as claimed in claim 1, wherein the first section further includes a first water chamber, which is fluidly communicable with the first flow passage system, and the second section further includes a second water chamber, which is fluidly communicable with the second flow passage system.

* * * * *